(12) United States Patent
Otremba et al.

(10) Patent No.: US 8,410,592 B2
(45) Date of Patent: Apr. 2, 2013

(54) SEMICONDUCTOR DEVICE AND METHOD FOR PRODUCING THE SAME

(75) Inventors: Ralf Otremba, Kaufbeuren (DE); Xaver Schloegel, Sachsenkam (DE)

(73) Assignee: Infineon Technologies, AG, Neubiberg (DE)

(*) Notice: Subject to any disclaimer, the term of this patent is extended or adjusted under 35 U.S.C. 154(b) by 259 days.

(21) Appl. No.: 11/869,363

(22) Filed: Oct. 9, 2007

(65) Prior Publication Data

US 2008/0087913 A1 Apr. 17, 2008

(30) Foreign Application Priority Data

Oct. 6, 2006 (DE) .................... 10 2006 047 761

(51) Int. Cl.
*H01L 23/02* (2006.01)
*H01L 23/48* (2006.01)
*H01L 23/52* (2006.01)
*H01L 21/00* (2006.01)
*H01L 21/44* (2006.01)

(52) U.S. Cl. ........ 257/678; 257/690; 257/781; 438/108; 438/661

(58) Field of Classification Search ............... 257/401, 257/666, 676, 678, 692, 750, 778, E23.031, 257/E23.01, E23.035, E23.043, 690, 781; 438/123, 106, 121, 661, 108, 615
See application file for complete search history.

(56) References Cited

U.S. PATENT DOCUMENTS

| | | | |
|---|---|---|---|
| 5,040,035 A * | 8/1991 | Gabara et al. ............ | 257/401 |
| 5,543,187 A * | 8/1996 | Errico et al. ............ | 428/34.6 |
| 6,133,634 A | 10/2000 | Joshi | |
| 6,582,990 B2 | 6/2003 | Standing | |
| 6,624,522 B2 | 9/2003 | Standing et al. | |
| 6,677,669 B2 | 1/2004 | Standing | |
| 6,767,820 B2 | 7/2004 | Standing et al. | |
| 6,890,845 B2 | 5/2005 | Standing et al. | |
| 6,911,692 B2 * | 6/2005 | Kobayashi et al. ........ | 257/329 |
| 7,524,775 B2 * | 4/2009 | Ewe et al. ............ | 438/778 |
| 2003/0096495 A1 * | 5/2003 | Ihara et al. ............ | 438/614 |
| 2004/0026755 A1 * | 2/2004 | Kim ............ | 257/414 |
| 2004/0080028 A1 | 4/2004 | Yanagisawa | |
| 2005/0023670 A1 * | 2/2005 | Hata et al. ............ | 257/690 |
| 2005/0032347 A1 | 2/2005 | Hase et al. | |
| 2005/0062165 A1 * | 3/2005 | Saenger et al. ............ | 257/774 |
| 2005/0062168 A1 * | 3/2005 | Sano et al. ............ | 257/778 |
| 2005/0062169 A1 * | 3/2005 | Dubin et al. ............ | 257/779 |
| 2006/0017174 A1 * | 1/2006 | Otremba ............ | 257/778 |
| 2006/0055015 A1 | 3/2006 | Zhaung | |
| 2006/0108671 A1 * | 5/2006 | Kasem et al. ............ | 257/676 |
| 2006/0138532 A1 | 6/2006 | Okamoto et al. | |
| 2007/0267729 A1 * | 11/2007 | Otremba ............ | 257/678 |

* cited by examiner

*Primary Examiner* — Matthew Landau
*Assistant Examiner* — Khaja Ahmad
(74) *Attorney, Agent, or Firm* — Edell, Shapiro & Finnan, LLC

(57) ABSTRACT

A semiconductor device includes a vertical transistor and an external contact plane. The transistor includes: a first side with a first load electrode and a control electrode, and an opposite second side with a second load electrode. The first side of the transistor faces the external contact plane. A dielectric layer extends from at least one edge side of the transistor as far as the second load terminal. An electrically conductive deposited layer is arranged on the dielectric layer and electrically connects the second load electrode to the second load terminal.

32 Claims, 2 Drawing Sheets

SEMICONDUCTOR DEVICE AND METHOD FOR PRODUCING THE SAME

CROSS REFERENCE TO RELATED APPLICATIONS

This application claims priority under 35 U.S.C. §119 to Application No. DE 102006047761.8 filed on Oct. 6, 2006, entitled "Semiconductor Device and Method for Producing It," the entire contents of which are hereby incorporated by reference.

BACKGROUND

It is generally desired to increase the power of semiconductor devices and at the same time to reduce the size of the semiconductor devices. In order to satisfy this desire, in recent years so-called chip size packages have been developed, which involve striving to reduce the external dimensions of the device to less than 120% of the dimensions of the semiconductor chip.

In the case of power semiconductor devices having a vertical transistor, devices have been developed in which the transistor is mounted in a manner turned over in the device in comparison with the conventional arrangement. The conventional top side, on which a load electrode and a control electrode, for example source and gate, are arranged, faces the external contact plane of the device. The conventional rear side of the transistor, on which a second load electrode (e.g., drain) is arranged, is remote from the external contact plane of the device.

Various variants of this type of semiconductor devices are known. The contact-connection between the second electrode and the contact plane, which is arranged at the opposite side of the transistor, is specified via a contact clip. The contact clip can be L-shaped, U-shaped or a well, on the areal region of which the rear side and second load electrode of the transistor is mounted.

The combination of the turned-over arrangement of the transistor and the contact clip provides a space-saving redistribution wiring and enables the size of the device to be reduced. At the same time, the power of the device is increased since long bonding wires are replaced as contact elements between the transistor and the external contacts of the device.

SUMMARY

Described herein is a semiconductor device, in particular a power semiconductor device, and a method for producing the same. The semiconductor device comprises a vertical transistor and an external contact plane. The transistor includes: a first side with a first load electrode and a control electrode, and an opposite second side with a second load electrode. The first side of the transistor faces the external contact plane. A dielectric layer extends from at least one edge side of the transistor as far as the second load terminal. An electrically conductive deposited layer is arranged on the dielectric layer and electrically connects the second load electrode to the second load terminal.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention is explained in more detail with reference to the figures, where.

DETAILED DESCRIPTION

Figure 1:
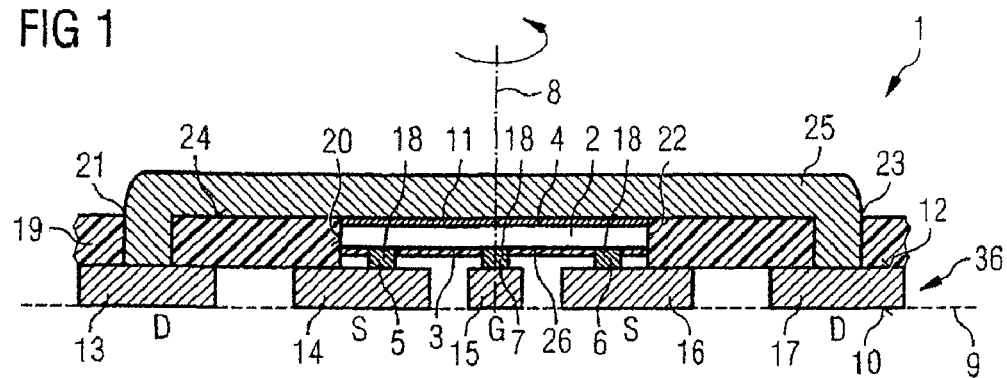
FIG. 1 shows a cross section of a semiconductor device according to a first embodiment.

Described herein is a semiconductor device with increased power and simplified method for producing the same. The semiconductor device comprises a vertical transistor, an external contact plane, a dielectric layer and a deposited electrically conductive layer. The vertical transistor has a first side and an opposite second side. The first side comprises a first load electrode and a control electrode and the second side comprises a second load electrode. The external contact plane provides at least a first load terminal, a control terminal and a second load terminal of the semiconductor device. The first side of the transistor faces the external contact plane. The dielectric layer extends from at least one edge side of the transistor to the second load terminal. The electrically conductive deposited layer is arranged on the dielectric layer and electrically connects the second load electrode to the second load terminal. The external contact plane provides the external contact areas of the semiconductor device.

According to the invention, the redistribution wiring between the second load terminal and the second load electrode, which is remote from the load terminal, is a deposited layer. Deposited layer should be understood to mean a layer which is constructed step by step or layer by layer on a surface.

The deposited layer is characterized by its microstructure. Since the electrically conductive layer is deposited, seeds form at the boundary with respect to the underlying surface and the electrically conductive layer builds up on the seeds. Consequently, a grown microstructure arises at least in the boundary region, the microstructure characterizing and verifying this method.

The electrically conductive layer comprises, at least in the regions which are in physical contact with the underlying layer, a textured microstructure reaching from the underlying layer. Furthermore, the deposited layer is microcrystalline.

This microstructure can be verified by a micrograph. Depending on the order of magnitude, the microstructure can be identified with the aid of a light microscope or electron microscope.

In contrast to a deposited layer, a contact well or a contact clip comprises a metal plate. The metal plate is characterized by a rolled texture or by a recrystallization texture. The grain size of the microstructure is larger than the grain size of a deposited layer. This can be verified by the surface structure of the well or contact clip and/or by a micrograph.

A deposited electrically conductive layer has the advantage that on account of the production method, the form of the contact element which electrically connects the second load electrode to the load terminal is adapted to the form and size of the transistor. In the case of semiconductor devices including a contact clip, the size of the transistor and the depth of the well are adapted to one another via an adhesive layer or soft solder layer between the second load electrode and the bottom of the well or contact clip. The properties of the semiconductor device are partly dependent on the connecting layer thickness, which can lead to variable power among different semiconductor devices. This problem can be avoided by depositing the redistribution wiring between the second load electrode and the second load terminal of the semiconductor device. Furthermore, the height of the semiconductor device can be reduced since no additional adhesive layer is used.

The electrically conductive layer therefore forms the rear side redistribution wiring or rear side contact element of the semiconductor device and can comprise a metal or alloy, for example copper. As an alternative, the electrically conductive layer can be a multilayer layer, wherein the layers have different compositions. This arrangement can be used to provide the bottom-most adhesion promoter layer and a contact layer arranged thereon. The adhesion-promoting and electrical properties of the contact element can thereby be optimized separately.

The semiconductor device comprises a dielectric layer extending from at least one edge side of the transistor to the second load terminal of the external contact plane of the semiconductor device. This layer serves as a substrate during the deposition of the electrically conductive layer. The dielectric layer can be formed by an organic material or a ceramic. Dielectric layer should be understood to mean a solid. Air or gas is ruled out in this case.

In one embodiment, the semiconductor device is free of a plastic housing composition. Consequently, the dielectric layer does not comprise plastic housing composition. The dielectric layer provides a protective layer for at least one edge side of the transistor. The first side and second side of the transistor can comprise a passivation layer in the regions with no electrode. The passivation layer can comprise polyimide, for example, and is produced during the wafer production method. Such a layer is typically deposited in the conventional wafer production methods, such that additional method steps are not necessary. Consequently, an additional device encapsulation method can be dispensed with, such that the production method is simplified.

In one embodiment, the semiconductor device further comprises a leadframe with a top side and an underside. The underside of the leadframe provides the external contact plane and the external contact areas of the semiconductor device. The leadframe comprises at least three separate parts which provide a first load terminal, a second load terminal and a control terminal.

The first load electrode of the transistor is mounted on the top side of a first part of the leadframe and the control electrode is mounted on the top side of a second part of the leadframe. These two parts are arranged separately from one another and at least partly below the transistor.

An external contact plane provided via a leadframe has the advantage that the arrangement of the external contact area of the device is independent of the arrangement of the electrodes on the first side of the transistor. In particular, the power of a transistor is dependent on its a real size. In the case of semiconductor devices in which the external contacts are arranged directly on the transistor, the arrangement of the external contact area is dependent on the size of the transistor. Therefore, a specific contact area arrangement on a circuit board is provided for each transistor size. Via a leadframe as external contact plane, transistors of different sizes can be provided in a device which has the same external terminals. This simplifies the construction of the circuit board on which the device is to be mounted, since the same circuit board can be used for different transistors.

In one embodiment, the dielectric layer extends between at least two parts of the leadframe. That part of the leadframe which provides the second load terminal is arranged alongside the edge side of the transistor. The dielectric layer can extend between the first load terminal part and the second load terminal part of the leadframe and/or between the control terminal part and the second load terminal part of the leadframe.

The dielectric layer can therefore form a bridge between these separate parts of the leadframe, which bridge carries and mechanically supports the electrically conductive layer. For this purpose, the dielectric layer can extend from the top side of the leadframe to at least the second side of the transistor. The dielectric layer can cover the edges between the second side and the edge sides of the transistor.

In one embodiment, the electrically conductive layer extends between the second load electrode and the top side of the load terminal part of the leadframe.

In one embodiment, the dielectric layer envelops the edge sides or each edge side of the transistor. The semiconductor body of the transistor can be completely covered by the electrodes, the passivation layers on the first side and also the dielectric layer which envelops at least the four edge sides. It is therefore possible for the semiconductor device to have no further plastic housing or molding compound.

In one embodiment, the dielectric layer comprises cutouts which leave free at least regions of the second load electrode. These free uncovered regions enable an electrical contact to the load electrode. A single cutout can be provided, which is adapted to the areal dimensions of the second load electrode. The second load electrode can almost cover the second side of the transistor as a single rear side electrode.

In one embodiment, the dielectric layer comprises cutouts which leave free at least regions of the second load electrode and at least regions of the top side of the leadframe part which provides the second load terminal. This enables an electrical connection between the leadframe or the second load terminal and the second load electrode. The electrically conductive layer is arranged at least partly in the cutouts.

In one embodiment the dielectric layer comprise a film, which can include polyimide. As an alternative, the dielectric layer can be a deposited layer, which comprises one or a plurality of polymers or a ceramic.

In one embodiment, the semiconductor device comprises a leadframe and a plurality of contact bumps arranged between the top side of the leadframe and the first side of the transistor. The first load electrode can include a plurality of contact bumps arranged on the first load terminal part of the leadframe, and the control electrode can include at least one contact bump arranged on the control terminal part of the leadframe. The contact bumps are electrically conductive and provide a part of the electrical connection between the load and control electrodes and the corresponding part of the leadframe.

The contact bumps provide a spacing between the first side of the transistor and the top side of the leadframe. The spacing improves the thermal capacity of the semiconductor device since less heat is dissipated into the leadframe and likewise into the circuit board. A larger proportion of the heat is dissipated via the top side of the semiconductor device. If the second load electrode is at ground potential, a heat sink can be mounted on the top side of the device or directly on the electrically conductive layer. This further reduces the proportion of heat that flows into the circuit board, and prevents damage to adjacent devices on the circuit board.

The transistor can be a MOSFET (Metal Oxide Semiconductor Field Effect Transistor) or a BJT (Bipolar Junction Transistor) or an IGBT (Insulated Gate Bipolar Transistor) or a power MOSFET or a power BJT or a power IGBT. In the case of a MOSFET, the first load electrode is the source, the control electrode is the gate and the second load electrode is the drain. In the case of an IGBT, the first load electrode is the emitter, the control electrode is the gate and the second load electrode is the collector.

In one embodiment, the contact areas of the external contact plane have a symmetrical pattern. In particular, the arrangement of the three different types of terminals has a symmetrical arrangement.

The external contact areas of the external contact plane of the semiconductor device comprise a device pattern, a so-called footprint, and the contact area of the substrate on which the device is mounted includes a substrate pattern. The device comprises a rotation axis arranged perpendicular to the external contact plane and at the geometrical midpoint of the external contact plane of the device.

The first load terminal, the second load terminal and the control terminal of the semiconductor device are arranged in the device pattern in the external contact plane such that, in a first orientation, the device pattern corresponds to the substrate pattern and such that, after a rotation of the power device by a selected rotation angle about the device axis, the first load terminal, the second load terminal and the control terminal are displaced among one another such that the device pattern corresponds to the substrate pattern, where the selected rotation angle is not 360°.

The device pattern corresponds to the substrate pattern if the device is arranged in at least two different orientations on the substrate pattern.

If the terminals are strip-type, for example, five parallel strip-type terminals can be provided in the device pattern and in the substrate pattern. These strips can be arranged in an order of drain, source, gate, source, drain. If the device is rotated through 180°, the arrangement of drain, source, gate, source, drain is retained since drain is displaced by drain, source is displaced by source and gate is displaced by itself.

The device can therefore be mounted with two orientations on the substrate pattern without the functionality of the device being changed in operation.

The first load terminal, the second load terminal and the control terminal of the semiconductor device are arranged in a device pattern in the terminal plane such that, in a first orientation, the device pattern can be mounted on the substrate pattern and the semiconductor device has a functionality, and such that, after a rotation of the power device by a selected rotation angle about the device axis, the device pattern can be mounted on the substrate pattern without the functionality of the semiconductor device changing during operation, where the selected rotation angle is not 360°.

This arrangement of the external contact terminals is practical since erroneous orientation of the device is avoided. Furthermore, the internal wiring within the device is simplified since a fan-in or fan-out redistribution wiring can be used in order that transistors of different sizes can be mounted within a housing with an external contact area arrangement or standard footprint. This fan-in or fan-out can be effected in a simple manner via a corresponding arrangement of the transistor on a leadframe.

The rotation angle can be 90°, 180° or 270°, or the rotation angle can be selected from one of the angles 90°, 180° and 270°.

The external contact areas of the semiconductor device can have different forms. Instead of a leadframe, it is possible to use solder balls and measurement contacts of the transistor as external contacts. The external contact areas of the device can have three-fold, four-fold, etc. symmetry.

A method for producing a semiconductor device comprising an external contact plane, which provides at least a first load terminal, a control terminal and a second load terminal of the semiconductor device, includes the following steps: a vertical transistor is provided, the transistor including a first side and an opposite second side. The first side comprises a first load electrode and a control electrode and the second side comprises a second load electrode. The transistor is arranged such that the first side of the transistor faces the external contact plane of the semiconductor device. A dielectric layer is applied, extending from at least one edge side of the transistor to the second load terminal of the semiconductor device. An electrically conductive layer is deposited on the dielectric layer with the second load electrode being electrically connected to the second load terminal.

The electrical contact between the load electrode and the second load terminal is produced via a layer constructed in layer-by-layer fashion. A rear side contact and rear side contact-connection can be deposited in one deposition step for a plurality of devices. This method is therefore suitable for the production of the rear side contact-connection of a plurality of semiconductor devices simultaneously. In contrast thereto, in the case of devices comprising a prefabricated rear side contact element such as a contact clip, the contact element is applied serially on the transistors.

During its growth, the electrically conductive layer is adapted to the form of the transistor and the dielectric layer. A deposited rear side contact-connection has the further advantage that height differences are compensated for and planarized during the layer deposition.

The electrically conductive redistribution wiring from the second side of the transistor to the external contact plane is deposited onto at least regions of the dielectric layer. The electrically conductive layer is also deposited on the second load electrode with formation of an electrical connection to the second load electrode. The boundary between the electrically conductive layer and the second load electrode and the dielectric layer is free of soft solder, adhesive or intermetallic phases of a diffusion solder.

The electrical connection to the load terminal of the semiconductor device can be formed by the arrangement of the layer on a predetermined contact, such as, for example, a part of a leadframe. The boundary between the deposited layer and the leadframe is free of soft solder, adhesive or intermetallic phases of a diffusion solder. As an alternative, a region of the electrically conductive layer can form the second load terminal.

In one implementation, the electrically conductive layer is deposited via electrolytic or electroless electrolytic or chemical deposition. Electrolytic deposition has the advantage that the layer is deposited only onto electrically conductive surface. If a dielectric layer with a patterned electrically conductive seed layer is provided, the electrically conductive layer is deposited only on this electrically conductive region. Electroless electrolytic deposition has the advantage that the electrically conductive layer is deposited on electrically conductive and also electrically non-conductive surfaces. A dielectric layer with an electrically insulating surface can be used in this case.

In one implementation, for depositing the electrically conductive layer first, a seed layer or an adhesion layer is deposited via a vacuum deposition method (e.g., vapor deposition, CVD (Chemical Vapor Deposition), PVD (Physical Vapor Deposition) and RF sputtering, DC sputtering). A seed layer can be deposited only on the dielectric layer or on the second load electrode and the dielectric layer simultaneously. In the first case, the seed layer can be applied before or after the application of the dielectric layer.

The seed layer can be reinforced by a second layer. The second layer can be applied via electrolytic deposition, sputtering or vapor deposition. The second layer can comprise a different composition. By way of example, the seed layer can comprise titanium and the second reinforcement layer can comprise copper. The seed layer can comprise two or more layers, which can be adhesion layer and/or diffusion barrier layers.

In one embodiment, the dielectric layer is deposited via a vacuum deposition method. The dielectric layer can be applied selectively or a closed layer can be patterned after its deposition in order that the second load electrode and the second load terminal are kept free. The dielectric layer can be deposited after the application of the transistor. As an alternative, the transistor can be applied into a cutout of an already patterned dielectric layer.

In a further embodiment, the dielectric layer is provided in the form of a film. The film is self-supporting and can be provided with an electrically conductive seed layer.

The film can be provided with cutouts before being applied. The cutouts can be produced via stamping, for example. In a further implementation, laser ablation, etching or photopatterning, for example, can be used to form cutouts into the dielectric layer after the application. The film can first be applied to the transistor and then the cutouts can be produced in order that the second load electrode is freely accessible. As an alternative, the film can first be applied on a carrier, the cutouts can be produced and then the transistor can be applied into a cutout of the film.

The carrier can be an auxiliary carrier that is removed after the electrically conductive layer has been produced. In a further embodiment, the carrier can be a leadframe or a leadframe strip comprising a plurality of device positions, which is a component of the device after the production method.

In one implementation, a leadframe with a top side and an underside is provided. The underside of the leadframe provides the external contact plane. The leadframe comprises at least three separate parts which provide a first load terminal, a second load terminal and a control terminal of the semiconductor device. The separate parts are held via connecting elements in a leadframe strip. The connecting elements are removed after the production of the devices on the leadframe strip in order to separate the devices from the leadframe strip.

The dielectric strength of the semiconductor device can be set by undercutting the underside of the leadframe. It is thereby possible to increase the creepage path between the two load terminal areas of the device.

The first load electrode and the control electrode of the transistor are arranged on the top side of separate parts of the leadframe. The first load electrode is mounted on the first load terminal part of the leadframe and the control electrode is mounted on the control terminal part of the leadframe and thereby electrically connected. This can be effected via a diffusion solder connection or a soft solder connection or an electrically conductive adhesive connection.

The electrically conductive layer providing the redistribution wiring between the second load electrode and the load terminal is deposited at low temperatures, for example, less than 100° C. Consequently, the thermal stability of the connections already produced between the first side of the transistor and the leadframe is of lesser importance than in known methods in which a contact element is applied on the second load electrode via a high temperature method, such as soldering. Consequently, adhesive and soft solder can be used without the first connection giving way during the contact-connection of the second load electrode. In the case of power semiconductor devices, the temperature loading of the device in operation is high, such that a more thermally stable connection such as diffusion solder may still be advantageous.

If a leadframe is provided, the dielectric layer can extend between at least two parts of the leadframe. The dielectric layer therefore provides a bridge between the parts, which carries the electrical layer applied thereto. The electrically conductive layer can extend between the first load terminal part and the second load terminal part and/or between the control terminal part and the second load terminal part of the leadframe.

In one implementation, the dielectric layer is applied such that it extends from the top side of the leadframe to at least the second side of the transistor. This provides a smooth path between the second load electrode and the leadframe. Consequently, it is possible to apply an electrically conductive layer having a more uniform thickness. This avoids the growth of regions having a smaller or larger thickness, which could result in undesired different current-carrying capacities of regions of the layer.

In one implementation, the dielectric layer is applied such that the edge sides of the transistor are enveloped by the dielectric layer. This has the advantage that the edge sides of the transistor are protected by the dielectric layer. An additional passivation layer need not be applied on the edge sides of the individual transistor.

In the following paragraphs, exemplary embodiments of the device and method are described in connection with the figures.

FIG. 1 shows a cross section of a semiconductor device 1 with a vertical transistor 2 and leadframe 36 according to a first embodiment. The transistor 2 is a power MOSFET and comprises a first side 3 and a second side 4 opposite the first side 3. The first side 3 of the transistor 2 comprises two source electrodes 5, 6 and a gate electrode 7, which is arranged between the two source electrodes 5, 6 and equidistantly from the two source electrodes 5, 6. The gate electrode 7 is arranged at the midpoint of the first side 3, as illustrated in the plan view of FIG. 2. Electrode should be understood to mean a contact area of the front side metallization.

The second side 4 of the transistor 2 comprises a drain electrode 11, which almost covers the entire second side 4. The first side 3 of the transistor 2 faces the top side 12 of the leadframe 36. The second side 4 of the transistor 2 is remote from the top side 12 of the leadframe 36. The transistor 2 is therefore arranged in a so-called flip-chip orientation.

The leadframe 36 comprises five parts 13 to 17 which are oriented in each case in strip-type fashion, parallel to one another and at distances from one another. This arrangement is illustrated in the plan view of FIG. 2. The leadframe 36 can be produced from a copper plate, such that the underside 10 of the five parts lie in a plane 9 and the top side 12 of the five parts lie in a plane that is essentially parallel to the underside.

In the first embodiment, the terminal plane 9 of the semiconductor device 1 is the underside 10 of the leadframe 36. The terminal plane 9 provides the external contact areas of the semiconductor device 1. In this embodiment, the external contact areas and consequently the semiconductor device 1 are surface-mountable.

In the view of FIG. 1, the five parts provide from left to right drain (D), source (S), gate (G), source (S) and drain (D) external terminal areas of the semiconductor device 1.

The transistor 2 is mounted on three parts 14, 15, 16 of the leadframe 36 which serve as a chip carrier. These three parts 14, 15, 16 are therefore arranged below the transistor 2. The drain parts 13, 17 of the leadframe 36 are in each case arranged alongside an edge side 20 of the transistor 2. The two source electrodes 5, 6 and the gate electrode 7 in each case comprise at least one spacer element 18 in the form of a contact bump 18 arranged on the surface of the electrodes 5, 6, 7. The contact bumps 18 were deposited on the source electrodes 5, 6, and on the gate electrode 7 of the transistor 2 prior to the separation of the transistor 2 from the wafer.

In operation, the transistor 2 generates a certain amount of heat which is to be dissipated from the device 1, such that the temperature of the semiconductor device 1 is kept below a specific limit value. An increased temperature can adversely affect the functionality of the semiconductor device 1. The heat can be dissipated relatively poorly from the leadframe 36 and from the circuit board on which the semiconductor device 1 is mounted. However, heat can be dissipated from the top side of the semiconductor device 1 into the surroundings or into a heat sink mounted thereon.

In order to better dissipate the heat from the semiconductor device 1, contact bumps 18 are provided on the source electrodes 5, 6 and also on the gate electrode 7. The contact bumps 18 are mounted on the top side 12 of the three parts 14, 15, and 16 via a diffusion solder connection (not shown). The first source electrode 5 is mounted on the first source part 14, the gate electrode 7 is mounted on the gate part 15 and the second source electrode 6 is mounted on the second source part 16 of the leadframe 36. The contact bumps 18 provide a spacing between the first side 3 of the transistor 2 and the top side 12 of the leadframe. The spacing serves to reduce the proportion of the heat which flows into the lead frame and into the circuit board. The proportion of the heat which flows upwards is increased, such that in operation the temperature of the semiconductor device 1 does not rise above the limit value.

The semiconductor device 1 further comprises a dielectric layer 19 in the form of a polyimide film which extends from the edge sides 20 of the transistor 2 across the top side 12 of the leadframe 36. The dielectric film 19 includes three cutouts 21, 22, 23, which are arranged above the first drain part 13 of the leadframe 36, the drain electrode 11 of the transistor and the second drain part 17 of the leadframe 36, and which leave free a region of the first drain part 13, of the drain electrode 11 and of the second drain part 17. The dielectric film 19 therefore provides bridges extending over the trenches between the first drain part 13 and the first source part 14 and also between the second drain part 17 and the second source part 16 of the leadframe 36.

The film 19 has a thickness corresponding approximately to the distance between the top side 12 of the leadframe 36 and the second side 4 of the transistor 2. The top side 24 of the film 19 is approximately coplanar with the second side 4 and the drain electrode 11 of the transistor. The film 19 therefore provides a planarization of the topology of the transistor 2 and of the leadframe 36.

The drain electrode 11, which is remote from the top side 12 of the leadframe 36, is electrically connected to the two drain parts 13, 17 of the leadframe 36 via an electrically conductive layer 25. The electrically conductive layer 25 essentially comprises copper and can be deposited electrolytically on the top side 24 of the dielectric film 19 and also on the drain electrode 11 and into the cutouts 21, 23 arranged above the leadframe 36. The electrically conductive layer 25 fills the cutouts 21, 23 and extends from the first drain part 13 of the leadframe 36 over the drain electrode 11 of the transistor 2 as far as the second drain part 17 of the leadframe 36. The electrically conductive layer 25 provides a redistribution wiring element between the drain electrode 11 and the two drain parts 13 and 17 of the leadframe 36 and has a U-shape.

The electrically conductive layer 25 can be deposited electrolytically in layer-by-layer fashion. Consequently, the layer 25 has a microstructure that is characteristic of this method. The microstructure at the boundary regions with respect to the underlying surface includes seeds composed of the material of the deposited layer. Consequently, the boundary between the electrically conductive layer 25 and the drain electrode 11 is free of an additional adhesion layer such as soft solder, adhesive or intermetallic phases of a diffusion solder connection since the layer 25 can be deposited directly on the drain electrode 11. The layer-by-layer construction of the layer is also characterized by a textured growth which can be detected together with a microcrystalline microstructure with the aid of a micrograph. The dielectric layer 25 provides a contact element via which the rear side 4 of the transistor 2 is electrically accessible from the external contact plane 9 lying on the opposite side of the transistor 2.

The first side 3 of the transistor 2 is not surrounded by the dielectric film 19. In the regions which are not electrically connected to the leadframe, the first side 3 comprises a passivation layer 26, which protects these uncovered regions. The surfaces of the transistor 2 can be completely covered by the dielectric layer 19, passivation layer 26 or the electrically conductive connections of the layer 25 and the contact bumps 18. The semiconductor device 1 can be free of molding composition.

The gate terminal 15 of the semiconductor device 1 is arranged at the midpoint of the external contact plane 9 of the semiconductor device 1. Two source terminals 14, 16 and two drain terminals 13, 17 are furthermore provided. In the cross section of FIG. 1, the terminals are arranged in the following order from left to right: drain, source, gate, source, drain.

The semiconductor device 1 has a device axis 8 arranged perpendicular to the terminal plane 9 and at the midpoint of the terminal plane 9. In the cross section of FIG. 2, the terminals are arranged mirror-symmetrically with respect to the axis 8. If the semiconductor device is rotated through 180° about the device axis 8, the arrangement of the terminals is retained (i.e., drain, source, gate, source, drain).

The semiconductor device 1 is mounted on a substrate comprising contact areas corresponding to the arrangement of the external contact terminals of the device. Owing to the mirror-symmetrical arrangement of the external contact terminals, the semiconductor device 1 can be mounted on the substrate in two different orientations in which the semiconductor device 1 has the same functionality.

The distance between the first source electrode 5 and the gate electrode 7 and the distance between the second source electrode 6 and the gate electrode 7 are approximately identical, such that the arrangement of the electrodes 5, 6, 7 of the first side 3 has a two-fold symmetry with respect to the device axis 8.

The production of the semiconductor device 1 is now explained with reference to FIGS. 2 and 3.

First, a transistor 2 is provided, comprising a first side 3 with two sources electrodes 5, 6 and a gate electrode 7 and a second side 4 with a drain electrode 11. Contact bumps 18 are arranged onto the three electrodes 5, 6, 7 of the first side 3. Three contact bumps 18 are situated on each source electrode 5, 6 and one contact bump 18 is situated on the gate electrode 7. The contact bumps 18 essentially have the same height. A leadframe strip 27 is also provided, which comprises a plurality of device positions 28 each including a leadframe 36 for a semiconductor device 1.

Figure 2:
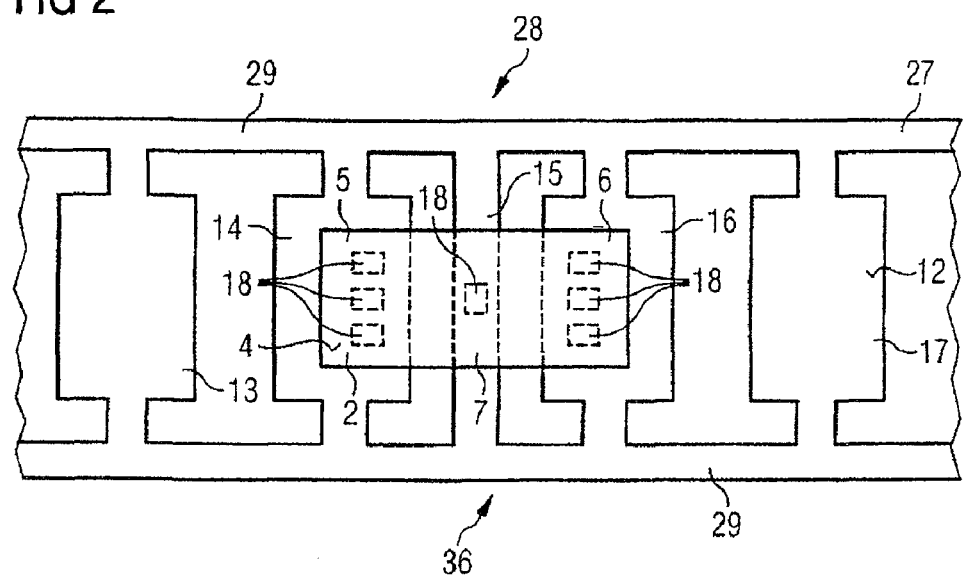
FIG. 2 shows the mounting of the transistor on a leadframe for the production of the semiconductor device from FIG. 1.

FIG. 2 shows a plan view of the leadframe strip 27. Each device position 28 includes five parts 13 to 17 of a leadframe 36 which are in each case essentially strip-type and oriented parallel to one another. The five parts 13 to 17 are connected to one another at the two short ends via connecting elements 29 and form the leadframe strip 27.

The first side 3 of the transistor 2 faces the top side 12 of the leadframe 36 and is mounted onto the top side 12 of the three inner parts 14, 15, 16 via the contact bumps 18. The first source electrode 5 is applied to the first source part 14, the gate electrode 7 is applied to the gate part 15 and the second source electrode 6 is applied to the second source part 16. The outer surface of the contact bumps 18 may be coated with a diffusion solder layer.

The leadframe strip 27 is heated to a temperature that is higher than the melting point of the diffusion solder. The diffusion solder melts and intermetallic phases form as a result of a reaction of the diffusion solder with the adjacent surfaces of the contact bump 18 and of the leadframe 36. The intermetallic phases have a melting point that is higher than the melting point of the diffusion solder. Consequently, the boundary between the contact bump 18 and the leadframe 36 solidifies on account of the formation of the intermetallic phases. The transistor 2 is thereby fixed on the leadframe 36 and the first source electrode 5 is electrically connected to the first source part 14, the gate electrode 7 is electrically connected to the gate part 15 and the second source electrode 6 is electrically connected to the second source part 16.

Figure 3:
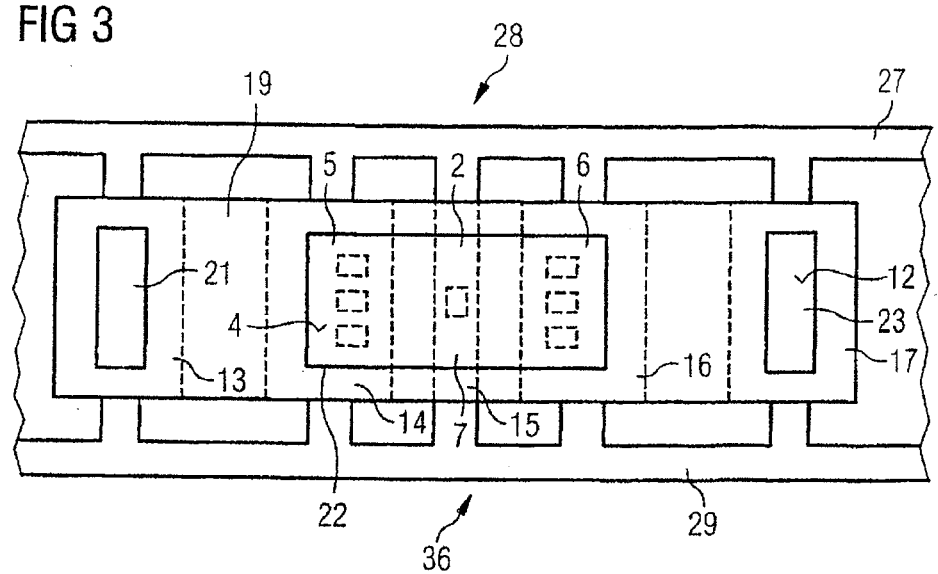
FIG. 3 shows the application of a dielectric layer on the leadframe from FIG. 2.

FIG. 3 shows the application of the dielectric film 19 comprising a polyimide on the mounted transistor 2 and the leadframe 36 from FIG. 2.

In this exemplary embodiment, the dielectric film 19 comprises three cutouts 21, 22 and 23, which may be produced by stamping in the film 19 prior to the application. The cutouts 21, 22, 23 are arranged in the film 19 in such a way that they correspond to the arrangement of the first 13 and second 17 drain part of the leadframe 36 and the second side 4 of the transistor 2. The cutouts 21 and 23 are approximately rectangular and arranged above the central region of the first 13 and second 17 drain parts. The central cutout 22 has a size that is somewhat smaller than the size of the transistor 2, such that the film 19 expands during mounting and the cutout 22 is in contact with the edge sides 20 of the transistor 2. The film 19 can be heated after the application on the mounted transistor 2 and leadframe 36 in order to produce a cohesive connection to the transistor 2 and the leadframe 36.

In further exemplary embodiments that are not shown, the cutouts in the dielectric layer will be produced after the application. For this purpose, the cutouts can be produced, for example, via laser ablation. If the dielectric layer is deposited in layer-by-layer fashion onto the transistor 2 and leadframe 36, the cutouts are subsequently produced in the closed layer.

The dielectric layer 19 serves for planarizing the topology of the transistor 2 and of the leadframe 36. For this purpose, the film 19 can have a thickness corresponding approximately to the thickness of the transistor 2 with contact bump 18. If the dielectric layer 19 is deposited in layer-by-layer fashion, the deposition can be carried out until the layer thickness corresponds to the height of the mounted transistor 2.

After the application of the dielectric film 19, the electrically conductive layer 25 can be electrolytically deposited on the arrangement of FIG. 3 in order to electrically connect the drain electrode 11 to the two drain parts 13, 17 of the leadframe 36. The electrically conductive layer 25 is deposited into the cutouts 21, 23 above the leadframe 36 and also on the planarized surface of the dielectric film 19 and the drain electrode 11. The electrically conductive layer 25 can be constructed in layer-by-layer fashion, such that a U-shaped structure is formed. The thickness of the layer 25 can be set by the deposition time, such that the layer 25 has a desired current-carrying capacity.

In a further embodiment, the electrically conductive layer of the semiconductor device 1 of FIG. 1 comprises two layers. First, a metallic seed layer can be deposited on the dielectric layer and uncovered regions of the drain parts 13, 17 of the leadframe 36 and the drain electrode 11. The seed layer can be applied via sputtering or vapor deposition. The seed layer provides an adhesion-promoting connection to the underlying surfaces and an electrically conductive surface. Afterwards, a second electrically conductive layer can be deposited via electrolytic deposition on the seed layer. The two layers provide the electrically conductive layer 25 and can comprise the same or different compositions. This two-layered layer is illustrated in FIG. 4.

Figure 4:
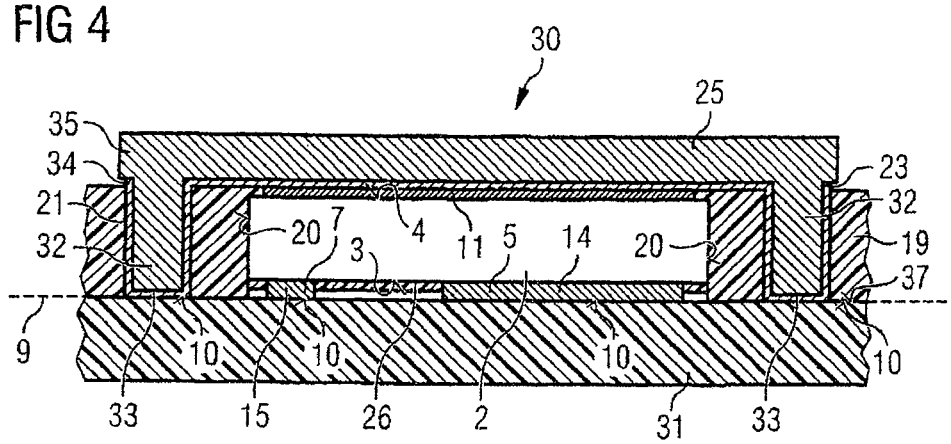
FIG. 4 shows a cross section of a semiconductor device according to a second embodiment.

FIG. 4 shows a semiconductor device 30 according to a second exemplary embodiment.

This exemplary embodiment differs from the first exemplary embodiment by virtue of the external contact plane 9 and also the construction of the electrically conductive layer 25. In this exemplary embodiment, the semiconductor device 30 does not comprise a leadframe, rather the underside of the source electrode 5, gate electrode 7 and the legs 32 of the electrically conductive layer 25 provide the external contact area of the semiconductor device 30. The transistor 2 comprises a single source electrode 5 and a gate electrode 7, which are arranged on the first side 3. The gate electrode is arranged in an edge region of the first side 3. The transistor is arranged with a flip-chip arrangement in the device 30, such that the first side 3 faces the external contact plane 9 and forms in part the external contact plane 9.

This semiconductor device 30 can be constructed on an auxiliary carrier 31, which can comprise an electrically conductive surface at least in the regions of the drain terminals 33. The first side 3 of the transistor 2 is fixed on the auxiliary carrier 31 via the source electrode 5 and gate electrode 7. This is followed by the application of the dielectric layer 19 comprising three cutouts (21, 22, 23), with enveloping of the edge sides 20 of the transistor 2 on the top side 37 of the auxiliary carrier 31. The electrically conductive layer 25 is then deposited. The auxiliary carrier 31 is subsequently removed.

In this exemplary embodiment, the electrically conductive layer 25 comprises two layers 34, 35. First, a thin adhesion layer 34 composed of titanium is deposited via sputtering on the uncovered surfaces of the dielectric layer 19, drain electrode 11 and auxiliary carrier 31. Afterwards, a second layer 35 comprising copper can be deposited electrolytically on the adhesion layer 34. The electrically conductive layer 25 has a U-shape and comprises legs 32. The lower surfaces of the legs 32 of the layer 25 provide the drain terminals 33 of the semiconductor device 30.

In a further exemplary embodiment, that is not shown, external contacts can be applied on the gate electrode 7, source electrode 6 and drain terminals 33 of the electrically conductive layer 25. The external contacts can be solder balls, a solderable layer or a solder layer.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A semiconductor device, comprising:
   a vertical transistor with a first side and an opposite second side, the vertical transistor comprising: a first load electrode and a control electrode disposed on the first side and a second load electrode disposed on the opposite second side;
   a first load terminal, a second load terminal, and a control terminal each disposed along an external contact plane of the semiconductor device, wherein the first side of the vertical transistor faces the external contact plane;
   a dielectric layer surrounding the vertical transistor and having formed therein a cutout to expose a contact area of the second load terminal that faces away from the external contact plane; and
   an electrically conductive deposited layer plated onto both the second load electrode of the vertical transistor and the contact area of the second load terminal of the device to form an electrically continuous solder-free connection between the second load electrode and the second load terminal through the cutout in the dielectric layer.

2. The semiconductor device according to claim 1, wherein the semiconductor device is free of a plastic housing composition.

3. The semiconductor device according to claim 1, further comprising:
   a leadframe with a top side and an underside, the leadframe comprising at least three separate parts including: the first load terminal, the second load terminal and the control terminal;
   wherein the underside of the leadframe comprises the external contact plane.

4. The semiconductor device according to claim 3, wherein the first load electrode and the control electrode of the vertical transistor are electrically coupled to the first load terminal and the control terminal at the top side of the leadframe.

5. The semiconductor device according to claim 3, wherein the dielectric layer extends across a gap between at least two parts of the at least three separate parts of the leadframe.

6. The semiconductor device according to claim 3, wherein the dielectric layer extends from the top side of the leadframe to the second side of the vertical transistor so as to be coplanar therewith.

7. The semiconductor device according to claim 3, wherein the electrically conductive layer extends between the second load electrode of the vertical transistor and the top side of the second load terminal part of the leadframe.

8. The semiconductor device according to claim 3, wherein:
   the first load electrode comprises a plurality of contact bumps arranged on the first load terminal part of the leadframe; and
   the control electrode comprises at least one contact bump arranged on the control terminal part of the leadframe.

9. The semiconductor device according to claim 1, wherein the dielectric layer surrounds the vertical transistor so as to be coplanar with the second side thereof.

10. The semiconductor device according to claim 1, wherein the dielectric layer comprises a polyimide film.

11. The semiconductor device according to claim 1, wherein the vertical transistor is one selected from the group including: MOSFET, BJT, IGBT, power MOSFET, power BJT and power IGBT.

12. The semiconductor device according to claim 1, wherein the first load terminal, the second load terminal and the control terminal of the semiconductor device are arranged in a device pattern in the external contact plane symmetrically about a device rotation axis such that, when rotated about the device rotation axis through a rotation angle, the device pattern remains in correspondence with respect to a first load terminal, a second load terminal and a control terminal of a substrate pattern.

13. The semiconductor device according to claim 12, wherein the rotation angle is an angle selected from the group including: 90°, 180° and 270°.

14. The semiconductor device according to claim 1, wherein the dielectric layer comprises a film that provides a bridge between the vertical transistor and the second load terminal, the electrically conductive deposited layer including a metallic adhesion layer extending over the dielectric layer such that the bridge mechanically supports the electrically conductive deposited layer from the second load electrode to the second load terminal.

15. The semiconductor device according to claim 1, wherein regions of the first side of the vertical transistor not covered by the first load electrode and the control electrode are covered by a passivation layer that is distinct from the dielectric layer.

16. The semiconductor device according to claim 1, further comprising a third load terminal positioned substantially symmetrically about the vertical transistor with respect to the second load terminal; and
   a dielectric layer extending from an edge side opposite from the at least one edge side of the vertical transistor to the third load terminal;
   wherein the electrically conductive deposited layer is plated onto the third load terminal to form an electrically continuous connection between the second load electrode of the vertical transistor and the second and third load terminals of the device.

17. The semiconductor device according to claim 1, wherein the electrically conductive deposited layer comprises a textured microstructure and is microcrystalline.

18. The semiconductor device of claim 1, wherein the electrically conductive deposited layer comprises a multi-layer structure including: a metallic adhesion layer plated on the second load electrode and the second load terminal; and a contact layer plated on the metallic adhesion layer, wherein a boundary between the electrically conductive deposited layer and the second load electrode is free from, soft solder, adhesive and intermetallic phases of a diffusion solder.

19. The semiconductor device of claim 1, wherein the electrically conductive deposited layer is plated by electrolytic deposition.

20. The semiconductor device of claim 1, wherein the electrically conductive deposited layer is plated by vapor deposition.

21. The semiconductor device of claim 1, wherein the electrically conductive deposited layer is plated by a combination of electrolytic deposition and vapor deposition.

22. The semiconductor device of claim 1, wherein the electrically conductive deposited layer is plated by sputtering.

23. The semiconductor device of claim 6, wherein the electrically conductive deposited layer is plated to conform to a shape of the vertical transistor and the dielectric layer.

24. A semiconductor device, comprising:
   a vertical transistor with a first side and an opposite second side, the vertical transistor comprising at least one first load electrode and a control electrode disposed on the first side and a second load electrode disposed on the opposite second side;
   at least one first load terminal, at least one second load terminal, and a control terminal each disposed along an external contact plane of the semiconductor device, wherein the first side of the vertical transistor faces the external contact plane;

a dielectric layer extending from at least one edge of the vertical transistor the at least one second load terminal; and an electrically conductive deposited layer plated onto the second load electrode of the vertical transistor, onto the dielectric layer, and onto the at least one second load terminal of the device form an electrically continuous solder-free connection between the second load electrode of the vertical transistor and the at least one second load terminal.

25. The semiconductor device of claim 24, wherein the electrically conductive deposited layer comprises a multi-layer structure including: a metallic adhesion layer plated on the second load electrode and on the second load terminal; and a contact layer plated on the metallic adhesion layer, wherein the metallic adhesion layer comprises a metallic seed layer including seeds of a metallic material.

26. The semiconductor device of claim 25, wherein the contact layer comprises a same material as the metallic adhesion layer.

27. The semiconductor device of claim 25, wherein the metallic adhesion layer comprises copper.

28. The semiconductor device according to claim 24, wherein the at least one second load terminal includes a pair of second load terminals positioned substantially symmetrically about the vertical transistor with respect to one another and wherein the electrically conductive deposited layer is plated over the dielectric layer and between the pair of second load terminals to form the electrically continuous solder-free connection between the second load electrode of the vertical transistor and the pair of second load terminals of the device.

29. The semiconductor device according to claim 24, wherein the electrically conductive deposited layer comprises a textured microstructure and is microcrystalline.

30. A semiconductor device, comprising:

a vertical transistor with a first side and an opposite second side, the vertical transistor comprising: at least two first load electrodes and a control electrode disposed on the first side so that control electrode is disposed between the two first load electrodes, and a second load electrode disposed on the opposite second side;

at least two first load terminals, at least two second load terminals, and a control terminal each disposed along an external contact plane of the semiconductor device, wherein the first side of the vertical transistor faces the external contact plane;

a dielectric layer surrounding the vertical transistor and having formed therein cutouts over the at least two second load terminals, the cutouts being formed in the dielectric layer to be perpendicular to the external contact plane; and an electrically conductive deposited layer plated on the second load electrode of the vertical transistor, on the dielectric layer and on the at least two second load terminals of the device to form an electrically continuous solder-free connection therebetween.

31. The semiconductor device of claim 30, wherein the contact layer comprises copper.

32. The semiconductor device according to claim 30, wherein the electrically conductive deposited layer comprises a textured microstructure and is microcrystalline.

* * * * *